United States Patent [19]

Opower et al.

[11] Patent Number: 5,209,944

[45] Date of Patent: May 11, 1993

[54] PROCESS FOR COATING A SUBSTRATE USING A PULSED LASER BEAM

[75] Inventors: Hans Opower, Krailling; Manfred Klose, Stuttgart, both of Fed. Rep. of Germany

[73] Assignee: Deutsche Forschungsanstalt fuer Luft- und Raumfahrt e.V., Bonn, Fed. Rep. of Germany

[21] Appl. No.: 730,550

[22] Filed: Jul. 16, 1991

[30] Foreign Application Priority Data

Jul. 18, 1990 [DE] Fed. Rep. of Germany ....... 4022817

[51] Int. Cl.⁵ .................... B05D 5/12; B05D 3/06; B23K 26/04; B23K 26/00
[52] U.S. Cl. .................... 427/569; 427/582; 219/121.62; 219/121.85
[58] Field of Search .......... 427/53.1, 42; 505/731, 505/732; 219/121.62, 121.85

[56] References Cited

U.S. PATENT DOCUMENTS

| | | | |
|---|---|---|---|
| 4,281,030 | 7/1981 | Silfvast | 427/53.1 |
| 4,701,592 | 10/1987 | Cheung | 427/53.1 |
| 4,987,007 | 1/1991 | Wagal et al. | 427/53.1 |
| 5,015,492 | 5/1991 | Venkatesan et al. | 427/53.1 |
| 5,019,552 | 5/1991 | Balooch et al. | 427/53.1 |
| 5,049,405 | 9/1991 | Cheung | 427/53.1 |
| 5,049,406 | 9/1991 | Geittner et al. | 427/53.1 |
| 5,080,753 | 1/1992 | Doll et al. | 427/53.1 |
| 5,084,300 | 1/1992 | Zander et al. | 427/53.1 |
| 5,094,880 | 3/1992 | Hongoh | 427/53.1 |
| 5,097,793 | 3/1992 | Shuhara et al. | 427/42 |
| 5,126,165 | 6/1992 | Akihama et al. | 427/53.1 |
| 5,145,713 | 9/1992 | Venkatesan et al. | 427/53.1 |

FOREIGN PATENT DOCUMENTS 263306 12/1988 German Democratic Rep. .

*Primary Examiner*—Marianne Padgett
*Attorney, Agent, or Firm*—Barry R. Lipsitz

[57] ABSTRACT

In order to so improve a process for the manufacture of a layer on a substrate wherein by means of a pulsed laser beam a coating material is ablated from a carrier, transported in the form of a current of particles to the substrate and deposited on the latter to form the layer, that it is suitable for the manufacture of thin precision layers, preferably in a defined number of atom layers, as is, for example, required in the manufacture of semiconductors, it is proposed that the layer be manufactured as thin precision layer by pulse duration and pulse intensity of the laser beam being selected such that ionization and heating-up of the coating material take place essentially only in the zone of interaction of the laser light with the coating material so the stream of particles is formed as cluster-free plasma containing single, non-coherent ions or atoms.

25 Claims, 2 Drawing Sheets

PROCESS FOR COATING A SUBSTRATE USING A PULSED LASER BEAM

The invention relates to a process for the manufacture of a layer on a substrate wherein by means of a pulsed laser beam a coating material is ablated from a carrier, transported in the form of a stream of particles to the substrate and deposited on the latter to form the layer.

Such a process is generally known for the coating of a substrate with laser ablation, and this process is usually employed for applying macroscopic coatings to the substrate.

The object underlying the invention is to so improve this known process that it is suited for the manufacture of thin precision layers, preferably in a defined number of atom layers, as is, for example, required in the manufacture of semiconductors.

This object is accomplished in accordance with the invention in a process of the kind described at the beginning by the layer being produced as a thin precision layer by pulse duration and the pulse intensity of the laser beam being selected such that ionization and heating-up of the coating material take place essentially only in the zone of interaction of the laser light with the coating material so the stream of particles is formed as cluster-free plasma containing single, non-coherent ions or atoms.

Hence the gist of the invention resides in controlling the creation of the stream of particles so as to prevent a considerably larger area than the zone of interaction of the laser light with the coating material from being ablated by heat conduction processes, which would result in the danger of the stream of particles including clusters, i.e., coherent atoms or ions. The inventive selection of pulse duration and pulse intensity of the laser beam such that the coating material will only be ablated in the zone of interaction of the laser light with the coating material ensures that the stream of particles will be substantially free of clusters and coherent atoms or ions. Hence, all disturbances in a thin precision layer which are caused by clusters or coherent ions and—for example, in semiconductor technology—would lead to the precision layer being unfit for use at least in the area of the disturbance, will be eliminated.

It is particularly expedient for the thickness of an ablated layer of the coating material to correspond at the most to the primary absorption length of the laser beam in the solid state of the coating material, so only those atoms of the coating material that interact directly with the laser beam are ablated.

It is particularly favorable for the coating material to be ionized and heated up with a thickness of the order of magnitude of one hundred or several hundred atom layers.

In a particularly expedient embodiment, provision is made for the pulse duration and pulse length to be selected such that a layer of the coating material is ionized and heated up with a thickness of approximately one hundred to one thousand angstroms.

In the embodiments of the inventive process described so far, no general limitation was given for the intensity, in particular in relation to the other individual parameters of the inventive process. For the inventive process to work particularly advantageously, the laser beam with an angular frequency $\omega_L$ corresponding to its wavelength should strike the surface of the coating material with an intensity $I_L$ which is greater than approximately $$0.1 \times I_O \times \frac{\omega_L^2}{\omega_O^2}$$

the intensity $I_O$ being approximately $$I_O = N_F \times \frac{E_i^{3/2}}{M^{1/2}}$$

with $N_F$ as particle density in the solid state, $E_i$ as mean energy per ion or atom in the stream of particles, M as mass of the ions or atoms and $\omega_O$ as plasma frequency of a plasma with a density of the order of magnitude of the density of the solid state of the coating material.

In the inventive process, it is, furthermore, advantageous for the laser beam with an angular frequency $\omega_L$ corresponding to its wavelength to strike the surface of the coating material with an intensity $I_L$ which is less than approximately $$10 \times I_O \times \frac{\omega_L^2}{\omega_O^2}$$

In an advantageous choice of parameters for the inventive process, the laser beam strikes the surface of the coating material with an intensity $I_L$ which lies in the range of between approximately $$0.2 \times I_O \times \frac{\omega_L^2}{\omega_O^2}$$

and approximately $$5 \times I_O \times \frac{\omega_L^2}{\omega_O^2}$$

With intensities within the indicated range it is ensured that the stream of particles will be substantially free of clusters and coherent atoms and ions.

In a range which is particularly advantageous, the laser beam has an intensity $I_L$ lying within the range of between approximately $$0.3 \times I_O \times \frac{\omega_L^2}{\omega_O^2}$$

and approximately $$3 \times I_O \times \frac{\omega_L^2}{\omega_O^2}$$

Optimum results are achieved with this set of parameters.

In all of the embodiments described so far, no special details were given about the pulse duration in conjunction with the wavelength of the laser beam. It is particularly advantageous to carry out the process with the laser beam having an angular frequency $\omega_L$ corresponding to its wavelength which is greater than or equal to the plasma frequency $\omega_P$ during a considerable part of the pulse duration $\tau$, with the development of the plasma frequency $\omega_P$ with respect to time resulting from the approximate expansion equation $$\omega_P^2 = \left(\frac{d}{d + tv_i}\right)\omega_0^2$$

with d being the thickness of the layer of coating material initially covered by the laser beam, t the time from the start of the pulse onwards and $v_i$ the velocity of the expansion of the plasma.

This condition advantageously results in penetration of the laser beam into the plasma at least during a considerable part of the pulse duration and hence in optimum heating-up of all ions or atoms of the plasma.

It is particularly advantageous for the laser beam to have an angular frequency $\omega_L$ which during at least approximately a third of the pulse duration $\tau$ is greater than or equal to the plasma frequency $\omega_P$.

It is even more advantageous for the laser beam to have an angular frequency $\omega_L$ which during at least approximately half of the pulse duration $\tau$ is greater than or equal to the plasma frequency $\omega_P$.

In the explanation of the above embodiments and conditions for the intensity and the wavelength, no details of an advantageous connection between the pulse duration and the wavelength were given. Within the scope of an embodiment of the inventive solution, it has proven particularly advantageous for the laser beam with an angular frequency $\omega_L$ corresponding to its wavelength to have a pulse duration $\tau$ which is greater than approximately $$0.1 \times \tau_O \times \frac{\omega_0^2}{\omega_L^2}$$

wherein approximately $$\tau_O = d \times E_i^{-1/2} \times M^{1/2}$$

with d as thickness of the ablated layer of coating material, $E_i$ as mean energy per ion or atom in the stream of particles and M as mass per ion or atom in the stream of particles.

A further advantageous marginal condition results from the laser beam with an angular frequency $\omega_L$ corresponding to its wavelength having a pulse duration $\tau$ which is smaller than approximately $$10 \times \tau_O \times \frac{\omega_0^2}{\omega_L^2}$$

with $\tau_O$ being determinable as indicated hereinabove.

In a particularly preferred range for the pulse duration $\tau$, the latter lies in the range of between approximately $$0.2 \times \tau_O \times \frac{\omega_0^2}{\omega_L^2}$$

and approximately $$5 \times \tau_O \times \frac{\omega_0^2}{\omega_L^2}$$

It is particularly preferred for the process to be carried out with the pulse duration $\tau$ lying in the range of between approximately $$0.3 \times \tau_O \times \frac{\omega_0^2}{\omega_L^2}$$

and approximately $$3 \times \tau_O \times \frac{\omega_0^2}{\omega_L^2}$$

In accordance with the invention, it is, furthermore, particularly advantageous for the pulse duration $\tau$ to be selected so short that the effect of the expansion of the plasma is essentially still negligible. This eliminates a number of problems arising from the fact that with increasing expansion of the plasma, the plasma frequency and hence the conditions for penetration of the light wave and the conditions for optimum heating-up of the plasma by the laser beam also change.

A particularly preferred quantitative relation for the pulse intensity $I_L$ and the pulse duration $\tau$ results from the relation $$I_L \times \tau \approx H$$

with H lying between approximately 1 and approximately 50 watt-sec/cm$^2$.

Further preferred quantitative values for the pulse duration are obtained by these being selected with a wavelength of 0.2 μm in the range of between approximately 1 and approximately 10 psec.

Quantitative values can also be specified for the wavelengths of the laser beam, it being preferable to work with wavelengths of the laser beam of <0.3 μm.

Preferred values for the mean kinetic energy of the ions and atoms in the stream of particles are of the order of magnitude of approximately 10 eV to approximately 100 eV.

In all of the embodiments of the inventive process described so far, no further details were given about the laser that is used. Use of a neodymium solid-state laser—designed as Nd-yag laser—has proven particularly expedient. Such lasers have wavelengths of approximately 1 μm.

As an alternative to this, it is, however, also advantageous to use a Ti-sapphire laser. This laser has wavelengths of approximately 0.8 μm.

Finally, it is also conceivable within the scope of an advantageous solution of the inventive process to use an excimer laser.

To attain the short pulse durations according to the invention, it is preferable for the laser radiation for generation of the pulse duration according to the invention to be mode-coupled.

In addition, the inventive wavelength of the laser beam is advantageously achieved by carrying out frequency multiplication of a fundamental wavelength.

Further features and advantages of the invention are set forth in the following description of an embodiment.

DETAILED DESCRIPTION

Figure 1:
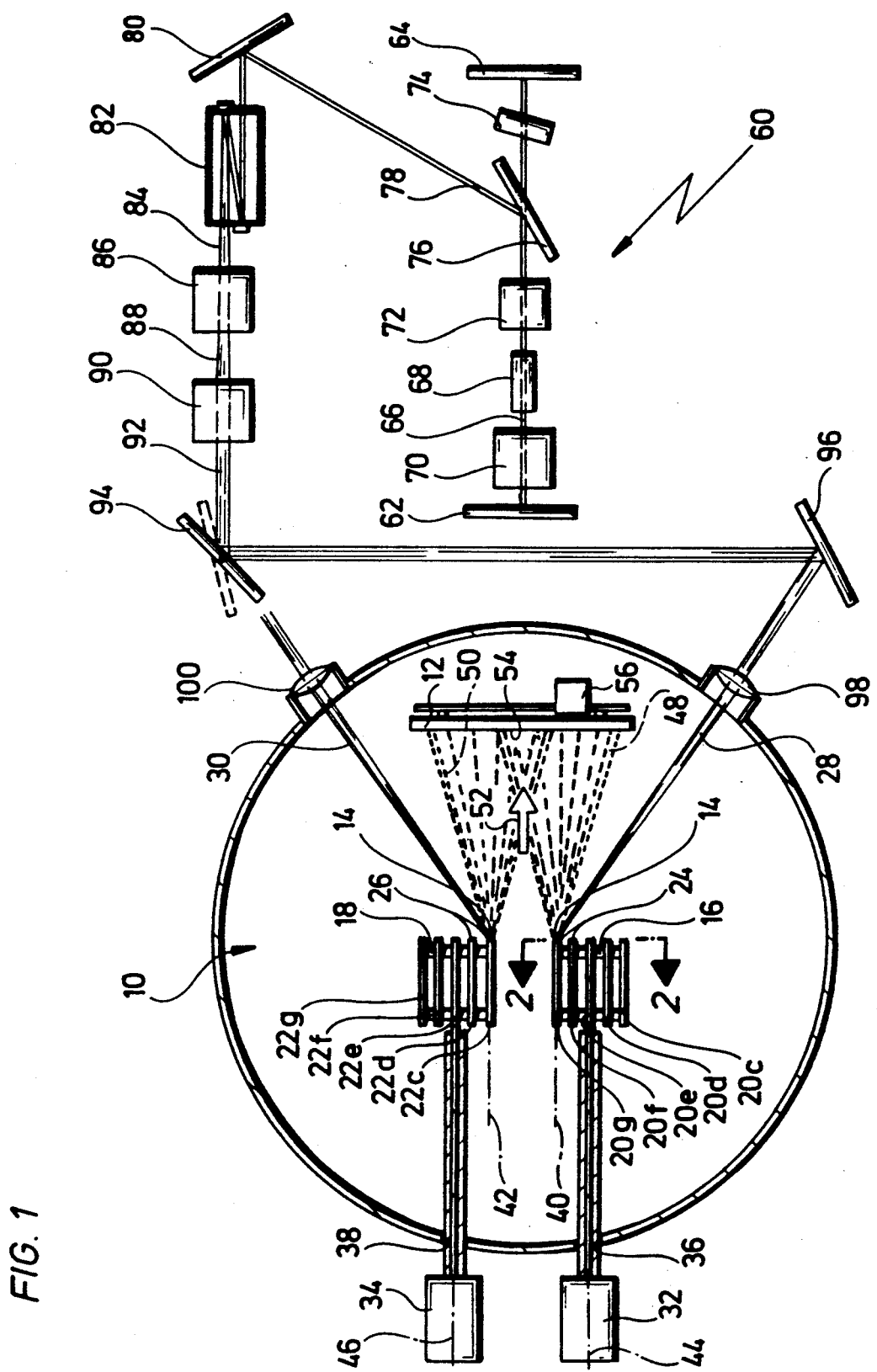
FIG. 1—an epitaxy system, operated in accordance with an embodiment of the inventive process.

An embodiment of the inventive process will be described with reference to an epitaxy system with a mode-coupled and frequency-multiplied titanium-sapphire laser illustrated in FIG. 1.

An ultra-high vacuum chamber 10 in which a substrate 12, for example, silicon is arranged opposite an ablation area 14 is provided for carrying out the process.

Pins 20 and 22 carried by a holder 16 and 18, respectively, and adapted to be acted upon by a laser beam 28 and 30, respectively, at a front end 24 and 26, respectively, preferably at an end face, are arranged in this ablation area 14. The pins 20 and 22, respectively, as carriers for the coating material are themselves preferably made of the coating material.

The laser beams 28, 30 are focused on a spatially fixed point in the ultra-high vacuum chamber 10 and so during the ablation from one of the pins 20, 22, the respective pin has to be made to follow in the direction of the focus of the respective laser beam 28, 30. This is preferably carried out via the holder 16, 18, each of the holders being arranged in a follow-up device 32 and 34, respectively, arranged outside the ultra-high vacuum chamber 10 and being guided via a passageway 36 and 38, respectively, into the ultra-high vacuum chamber 10 and slidable parallel to a longitudinal axis 40 and 42, respectively, of the pins 20, 22 in the ultra-high vacuum chamber 10. Hence continuous feeding of the pins 20 and 22, respectively, is carried out by this follow-up device 32 and 34, respectively, so the end 24 and 26, respectively, of the respective pin 20 and 22, respectively, is acted upon by the focus of the respective laser beam 28 and 30, respectively.

Figure 2:
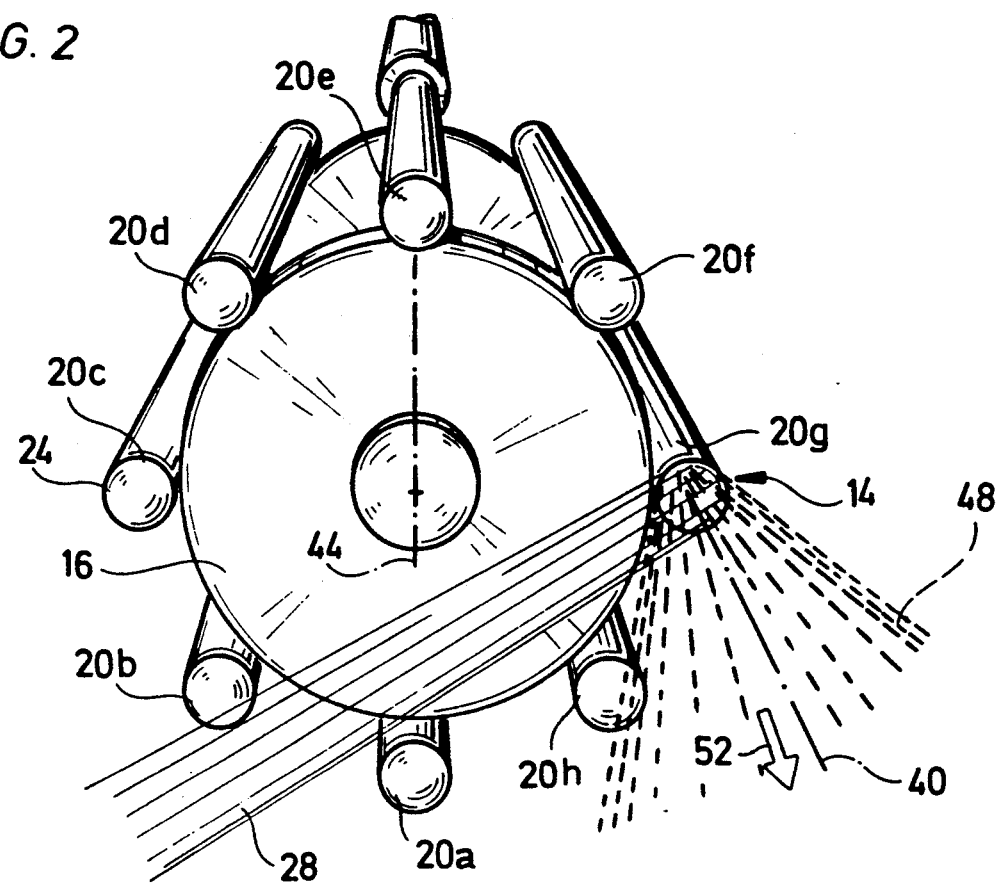
FIG. 2—a section taken along line 2—2 in FIG. 1.

It is preferable for not only one pin 20 and 22, respectively, to be held on each of the holders 16 and 18, respectively, but, as illustrated in FIG. 2, for a number of pins 20a to h and 22a to h to be placed in a turret arrangement, with one of the pins 20a to h and one of the pins 22a to h being respectively positionable in the ablation area 14. In order to subsequently position the pins 20a to h and 22a to h in the ablation area 14, each holder 16 and 18, respectively, is additionally rotatable about a longitudinal axis 44 and 46, respectively, parallel to the longitudinal axis 40 and 42, respectively, of the pins 20 and 22, respectively, with rotation of the holders 16 and 18, respectively, likewise being carried out via the respective follow-up device 32 and 34, respectively.

During the ablation, a stream of particles 48 and 50, respectively, emanates from each of the pins 20 and 22, respectively, standing in the ablation area 14, and the two streams of particles 48 and 50, respectively, have such a beam angle that they coat the substrate 12 over the entire desired surface.

The direction of the laser beams 28 and 30, respectively, is preferably selected such that the streams of particles 48 and 50, respectively propagate in a direction of propagation 52 which preferably stands perpendicular on a surface 54 of the substrate 12. In the cases where the beam angle of the streams of particles 48 and 50, respectively, is smaller than the area of the substrate 12 to be coated, a sliding device 56 can be additionally provided to slide the substrate 12 preferably perpendicular to the direction of propagation 52. Insofar as the area acted upon by the respective stream of particles 48 and 50, respectively, i.e., the cross-sectional area of the respective stream of particles 48 and 50, respectively, is to be additionally varied, the sliding device 56 can, however, also serve to slide the substrate 12 in the direction of propagation 52.

The two laser beams 28 and 30, respectively, are generated by a titanium-sapphire laser designated in its entirety 60 and comprising a resonator which has two end mirrors 62 and 64 and in the beam path 66 of which a titanium-sapphire crystal 68 is arranged. Also arranged in the beam path 66 are a mode locker 70 and a Pockels cell 72, with the latter serving to turn the polarization in the beam path 66. A selection prism 74 is provided for wave selection in the beam path 66 and coupling-out is carried out via a Brewster reflector which allows a coupled-out beam 78 to exit transversely to the beam path 66. This coupled-out beam 78 strikes a deflection mirror 80 which first sends the coupled-out beam through a titanium-sapphire amplifier 82 to further amplify the power of the coupled-out beam 78.

A reinforced laser beam 84 emerging from the titanium-sapphire amplifier with a wavelength of 800 nm is doubled in a frequency doubler 86 and continues as doubler laser beam 88 and is doubled again in a further frequency doubler 90, which finally results in an output laser beam 92 with a wavelength of 200 nm.

This output laser beam 92 strikes a rotating mirror 94 which is fixable in two positions. In a first position, illustrated in continuous lines in FIG. 1, the output laser beam 92 is reflected onto a further deflection mirror 96 and passes from the latter as laser beam 28 through an optical focusing device 98 into the ultra-high vacuum chamber 10.

Alternatively to the first position, the rotating mirror 94 can be brought into a second position, illustrated in dashed lines in FIG. 1, so the output laser beam 92 is directly reflected from the rotating mirror 94 via an optical focusing device 100 into the ultra-high vacuum chamber as laser beam 30. The optical focusing devices 98 and 100, respectively, are metered such that the laser beams 28 and 30, respectively, are focused in the intended ablation area 14, for example, such that they act on the entire end face of the respective pin 20 and 22, respectively, standing in the ablation position essentially over the entire area thereof and hence bring about ablation on the entire surface.

The inventive epitaxy system according to FIG. 1 operates in such a way that coating material is ablated either with laser beam 28 from pin 20 or with laser beam 30 from pin 22. This makes it possible, for example, for different coating materials to be subsequently deposited by evaporation in different layers on the substrate 12 and for the desired layer structure to be thereby obtained. In addition, the arrangement of several pins 20a to h and 22a to h, respectively, offers the possibility of also depositing more than two coating materials by different pins 20a to h and 22a to h, respectively, being made of different coating materials. Hence changeover from pin 20a to pin 20c and back is, for example, also possible.

Figure 3:
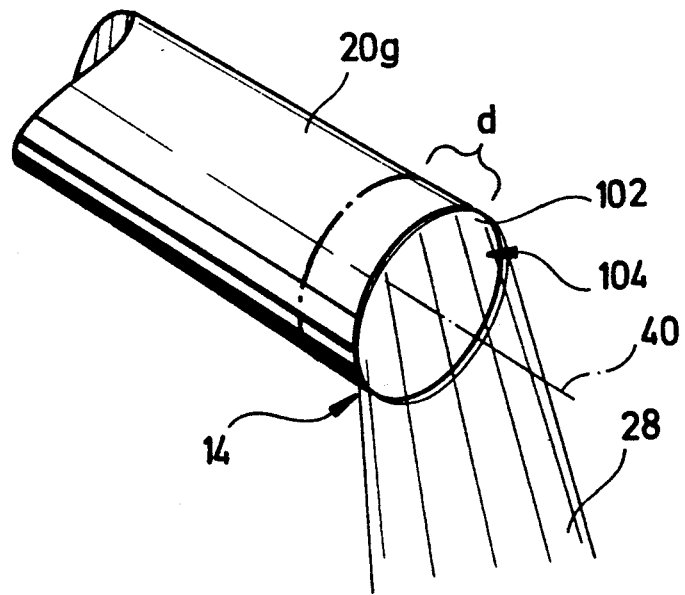
FIG. 3—an enlarged illustration of the front end of one of the pins illustrated in FIG. 1.

The relations during the ablation are illustrated by way of example on a non-uniformly enlarged scale in FIG. 3 with ablation from pin 20 by means of laser beam 28. The laser beam 28 is focused on an end face 102 of the pin 20a such that as focusing area 104 covers the entire end face 102 and generates in a disc having a thickness d a plasma which, in accordance with the invention, represents a cluster-free plasma containing single, non-coherent atoms or ions.

The conditions for the intensity I required in accordance with the invention result from the assumption that the pulse duration $\tau_O$ is to be so short that there will be no expansion of the plasma generated in the layer of thickness d during the pulse duration $\tau_O$. In this case, the intensity $I_O$ is approximately $$I_O \times \tau_O = d \times N_F \times E_i$$

with $N_F$ as particle density in the solid state and $E_i$ as kinetic energy of the ions or atoms in the plasma, with the ionization energy being neglected.

Furthermore, by placing $$\tau_O \approx \frac{d}{V_i}$$

with $v_i$ as velocity of the ions or atoms in the expanding plasma, one obtains an approximate formula $$I_O \approx N_F \frac{E_i^{3/2}}{M^{1/2}}$$

with M as mass of the ions or atoms in the plasma.

On the basis of an approximate, one-dimensional expansion of the plasma, one can apply the relation for the intensity $I_L$ for longer pulse durations $$\frac{I_L}{I_O} = \frac{N_P}{N_F} = \frac{d}{V_i \times \tau}$$

with $v_i \times \tau$ as thickness of the layer of the expanding plasma and $N_P$ as particle density in the expanding plasma.

Furthermore, the known relation for the plasma frequency $$\omega_P^2 = \frac{N_P \times e^2}{\epsilon_O \times m}$$

with m as electron mass leads to the relation $$I = I_O \frac{\omega_L^2}{\omega_O^2}$$

if one further assumes that the angular frequency $\omega_L$ corresponding to the wavelength of the laser beam is to be identical with the plasma frequency $\omega_P$ of the plasma. This assumption results from the fact that penetration of the laser beam and hence intensive interaction with the plasma are only possible when $\omega_L$ is $> \omega_P$, whereas when $\omega_L$ is $< \omega_P$ the plasma reflects the laser beam and, therefore, also the conditions for heating-up and ionization are unfavorable.

With these considerations, a relation for the pulse duration $\tau$ can also be set up as follows:

$$\tau = \tau_O \times \frac{\omega_O^2}{\omega_L^2}$$

with $$\tau_O = d \times E_i^{-\frac{1}{2}} \times M^{\frac{1}{2}}$$

This is achieved by way of example by the focusing area having a diameter of 0.2 mm and being irradiated with $10^{12}$ W/cm$^2$. In this case, the laser power is approximately $3 \cdot 10^8$ W, the pulse duration approximately 10 psec, the pulse energy 3 mWsec, the wavelength 200 nm and the repetition frequency of the individual pulses approximately 100 Hz.

What is claimed is:

1. A process for the manufacture of a layer on a substrate, wherein by means of a pulsed laser beam a coating material is ablated from a source, transported in the form of a stream of particles to the substrate and deposited on the latter to form the layer, and wherein said layer is produced by selecting a pulse duration and pulse intensity for said laser beam such that ionization and heating-up of said coating material take place essentially only in a zone of interaction of light from the laser beam with said coating material so that said stream of particles is formed as cluster-free plasma containing single, non-coherent ions or atoms.

2. A process as defined in claim 1, wherein an ablated layer of said coating material has a thickness that corresponds at most to the primary absorption length of said laser beam in the solid state of said coating material.

3. A process as defined in claim 1, wherein a layer of said coating material on said source with a thickness on the order of magnitude of one hundred or several hundred atom layers is ionized and heated up.

4. A process as defined in claim 1, wherein the pulse duration and the pulse intensity of said laser beam are selected such that a layer of said coating material on said source with a thickness of approximately 100 to 1000 angstrom is ionized and heated up.

5. A process as defined in claim 1, wherein said laser beam with an angular frequency $\omega_L$ corresponding to its wavelength strikes a surface of said source with an intensity $I_L$ which is greater than approximately $$0.1 \times I_O \times \frac{\omega_L^2}{\omega_O^2}$$

$I_O$ being approximately equal to $$I_O = N_F \times \frac{E_i^{3/2}}{M^{1/2}}$$

with $N_F$ as particle density in the solid state, $E_i$ as mean kinetic energy per ion with ionization energy being neglected or mean kinetic energy per atom in the stream of particles, M as mean mass per ion or atom in the stream of particles and $\omega_O$ as plasma frequency of a plasma with a density on the order of magnitude of the solid state density $N_F$.

6. A process as defined in claim 1, wherein said laser beam with an angular frequency $\omega_L$ corresponding to its wavelength strikes a surface of said source with an intensity $I_L$ which is smaller than approximately $$10 \times I_O \times \frac{\omega_L^2}{\omega_O^2}$$

$I_O$ being approximately equal to $$I_O = N_F \times \frac{E_i^{3/2}}{M^{1/2}}$$

with $N_F$ as particle density in the solid state, $E_i$ as mean kinetic energy per ion with ionization energy being neglected or mean kinetic energy per atom in the stream of particles, M as mean mass per ion or atom in the stream of particles and $\omega_O$ as plasma frequency of a plasma with a density on the order of magnitude of the solid state density $N_F$.

7. A process as defined in claim 5, wherein said laser beam strikes the surface of said source with an intensity $I_L$ which lies in the range of between approximately $$10 \times I_O \times \frac{\omega_L^2}{\omega_O^2}$$

and approximately $$5 \times I_O \times \frac{\omega_L^2}{\omega_O^2}.$$

8. A process as defined in claim 7, wherein said laser beam strikes the surface of said source with an intensity $I_L$ which lies in the range of between approximately $$0.3 \times I_O \times \frac{\omega_L^2}{\omega_O^2}$$

and approximately $$3 \times I_O \times \frac{\omega_L^2}{\omega_O^2}.$$

9. A process as defined in claim 1, wherein said laser beam has an angular frequency $\omega_L$ corresponding to its wavelength which during at least a part of the pulse duration is greater than or equal to a plasma frequency $\omega_P$, with the plasma frequency $\omega_P$ being determinable at any point in time from $$\omega_P^2 = \left(\frac{d}{d + tv_i}\right)\omega_O^2$$

d being a thickness of a layer of coating material on said source initially covered by the laser pulse, t a time from a start of the pulse onwards and $v_i$ a velocity of the expansion of the plasma.

10. A process as defined in claim 9, wherein said laser beam angular frequency $\omega_L$, during at least approximately one third of the pulse duration $\tau$, is greater than or equal to the plasma frequency $\omega_P$.

11. A process as defined in claim 10, wherein said laser beam angular frequency $\omega_L$, during at least approximately half of the pulse duration $\tau$, is greater than or equal to the plasma frequency $\omega_P$.

12. A process as defined in claim 1, wherein said laser beam with an angular frequency $\omega_L$ corresponding to its wavelength has a pulse duration $\tau$ which is greater than approximately $$0.1 \times \tau_O \times \frac{\omega_O^2}{\omega_L^2}$$

wherein $$\tau_O \approx d \times E_i^{-\frac{1}{2}} \times M^{\frac{1}{2}}$$

with d being a thickness of a layer of coating material on said source material initially covered by the laser pulse, E as mean kinetic energy per ion with the ionization energy being neglected or mean kinetic energy per atom in the stream of particles, and M as mean mass per ion or atom in the stream of particles.

13. A process as defined in claim 1, wherein said laser beam with an angular frequency $\omega_L$ corresponding to its wavelength has a pulse duration $\tau$ which is less than approximately $$10 \times \tau_O \times \frac{\omega_O^2}{\omega_L^2}$$

wherein $$\tau_O \approx d \times E_i^{-\frac{1}{2}} \times M^{\frac{1}{2}}$$

with d being a thickness of the layer of coating material on said source initially covered by the laser pulse, $E_i$ as mean kinetic energy per ion with the ionization energy being neglected or mean kinetic energy per atom in the stream of particles, and M as mean mass per ion or atom in the stream of particles.

14. A process as defined in claim 12, wherein said laser beam pulse duration $\tau$ lies in the range of between approximately $$0.2 \times \tau_O \times \frac{\omega_O^2}{\omega_L^2}$$

and approximately $$3 \times \tau_O \times \frac{\omega_O^2}{\omega_L^2}$$

15. A process as defined in claim 13, wherein said laser beam pulse duration $\tau$ lies in the range of between approximately $$3 \times \tau_O \times \frac{\omega_O^2}{\omega_L^2}$$

and approximately $$3 \times I_O \times \frac{\omega_L^2}{\omega_O^2}.$$

16. A process as defined in claim 1, wherein the pulse duration $\tau$ is selected so short that any effect of an expansion of the plasma is negligible.

17. A process as defined in claim 1, wherein a pulse intensity $I_L$ and pulse duration $\tau$ of said laser beam are selected such that $$I_L \times \tau \approx H$$

with H lying between approximately 1 and 50 watt-seconds/cm².

18. A process as defined in claim 1, wherein the laser beam has a wavelength of substantially 0.2 μm and a pulse duration in the range of between approximately 1 and approximately 10 psec.

19. A process as defined in claim 1, wherein said laser beam has a wavelength of smaller than 0.3 μm.

20. A process as defined in claim 1, wherein a stream of particles with ions or atoms of a mean kinetic energy $E_i$ on the order of magnitude of approximately 10 eV to approximately 100 eV is generated.

21. A process as defined in claim 1, wherein an Nd solid-state laser is used to provide said laser beam.

22. A process as defined in claim 1, wherein a Ti-sapphire laser is used to provide said laser beam.

23. A process as defined in claim 1, wherein an excimer laser is used to provide said laser beam.

24. A process as defined in claim 12, wherein the laser beam having pulse duration τ is generated using mode-coupled laser radiation.

25. A process as defined in claim 9, wherein the wavelength of said laser beam is provided by frequency multiplication of a fundamental wavelength.

* * * * *